United States Patent
Hong et al.

(10) Patent No.: US 11,430,835 B2
(45) Date of Patent: Aug. 30, 2022

(54) ORGANIC LIGHT EMITTING DISPLAY DEVICE

(71) Applicant: SAMSUNG DISPLAY CO., LTD., Yongin-si (KR)

(72) Inventors: Sangmin Hong, Cheonan-si (KR); Heeseong Jeong, Seoul (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 71 days.

(21) Appl. No.: 16/827,371

(22) Filed: Mar. 23, 2020

(65) Prior Publication Data
US 2020/0219943 A1   Jul. 9, 2020

Related U.S. Application Data

(63) Continuation of application No. 15/910,199, filed on Mar. 2, 2018, now Pat. No. 10,600,847.

(30) Foreign Application Priority Data

Mar. 2, 2017 (KR) ................ 10-2017-0027144

(51) Int. Cl.
*H01L 27/32* (2006.01)
*H01L 51/52* (2006.01)

(52) U.S. Cl.
CPC ...... *H01L 27/3216* (2013.01); *H01L 27/3218* (2013.01); *H01L 27/3258* (2013.01);
(Continued)

(58) Field of Classification Search
CPC ............ H01L 27/3216; H01L 27/3218
See application file for complete search history.

(56) References Cited

U.S. PATENT DOCUMENTS 8,698,395 B2   4/2014   Im et al.
8,810,567 B2   8/2014   Niioka et al.
(Continued)

FOREIGN PATENT DOCUMENTS

JP   2016-009636   1/2016
KR   10-2006-0059068   6/2006
(Continued)

OTHER PUBLICATIONS

Office Action dated Sep. 1, 2021 in corresponding Korean Patent Application No. 10-2017-0027144.
(Continued)

*Primary Examiner* — Raj R Gupta
(74) *Attorney, Agent, or Firm* — F. Chau & Associates, LLC

(57) ABSTRACT

An OLED display device includes a substrate, a first protection layer substrate, conductive lines extending substantially in a first direction, a second protection layer, a first electrode overlapping at least a part of the conductive lines, a pixel defining layer including an opening exposing at least a part of the first electrode, an organic light emission layer, and a second electrode. The opening is divided into a first polygon and a second polygon with respect to an imaginary straight line that passes through the opening at a maximum length in the first direction. A planar area of the first polygon is different from a planar area of the second polygon.

20 Claims, 7 Drawing Sheets

(52) U.S. Cl.
CPC ...... *H01L 27/3276* (2013.01); *H01L 27/3279* (2013.01); *H01L 51/5209* (2013.01)

(56) References Cited

U.S. PATENT DOCUMENTS

| | | | |
|---|---|---|---|
| 9,818,803 B2 | 11/2017 | Lee | |
| 2015/0379924 A1* | 12/2015 | Matsueda | ............ G09G 3/3208 |
| | | | 345/690 |
| 2016/0071910 A1 | 3/2016 | Sasaki et al. | |
| 2016/0148981 A1* | 5/2016 | Matsueda | ........... H01L 27/3218 |
| | | | 257/40 |
| 2016/0260792 A1* | 9/2016 | Kim | ................... H01L 27/3276 |
| 2016/0329391 A1 | 11/2016 | Ko et al. | |
| 2018/0254304 A1 | 9/2018 | Hong et al. | |

FOREIGN PATENT DOCUMENTS

| | | |
|---|---|---|
| KR | 10-2012-0028842 | 3/2012 |
| KR | 10-2012-0042068 | 5/2012 |
| KR | 10-2016-0048744 | 5/2016 |
| KR | 1020160108669 | 9/2016 |
| KR | 10-2016-0130895 | 11/2016 |
| KR | 10-2017-0005252 | 1/2017 |

OTHER PUBLICATIONS

Office Action dated Mar. 3, 2022 in corresponding Korean Patent Application No. 10-2017-0027144.

* cited by examiner

ORGANIC LIGHT EMITTING DISPLAY DEVICE

CROSS-REFERENCE TO RELATED APPLICATIONS

This application is a confirmation application of U.S. patent application Ser. No. 15/910,199 filed Mar. 2, 2018, which claims priority under 35 U.S.C. § 119 to Korean Patent Application No. 10-2017-0027144, filed on Mar. 2, 2017, the disclosures of which are incorporated by reference herein in their entirety.

TECHNICAL FIELD

Exemplary embodiments of the present invention relate to an organic light emitting diode (OLED) display device having improved display characteristics.

DISCUSSION OF RELATED ART

Organic light emitting diode (OLED) display devices are self-light emitting display devices that display images using an OLED that emits light. OLED display devices provide improved display characteristics such as low power consumption, high luminance, and high reaction speed.

OLED display devices have a multi-layer structure which includes an OLED. The multi-layer structure may produce a color shift depending on the viewing angle when the OLED display devices emit light.

For example, when a lower portion of a pixel electrode is non-uniform or asymmetric, a perceived color may vary depending on a viewing angle.

SUMMARY

Exemplary embodiments of the present invention are directed to an organic light emitting diode (OLED) display device having improved display characteristics.

According to an exemplary embodiment of the present invention, an organic light emitting display device includes a substrate, a first protection layer disposed on the substrate, a plurality of conductive lines disposed on the first protection layer and extending substantially in a first direction, a second protection layer disposed on the conductive lines, a first electrode disposed on the second protection layer and overlapping at least a part of the conductive lines, a pixel defining layer disposed on the second protection layer and including an opening exposing at least a part of the first electrode, an organic light emission layer disposed on the first electrode, and a second electrode disposed on the organic light emission layer. The opening is divided into a first polygon and a second polygon with respect to a first imaginary straight line that passes through the opening at a maximum length in the first direction. A planar area of the first polygon is different from a planar area of the second polygon. An overlap area between the first polygon and the conductive lines and an overlap area between the second polygon and the conductive lines have a ratio in a range from about 1:0.8 to about 1:1.2.

In an exemplary embodiment, an overlap area between the first polygon and the conductive lines is substantially equal to an overlap area between the second polygon and the conductive lines.

In an exemplary embodiment, the planar area of the first polygon and the planar area of the second polygon have a ratio in a range from about 1:0.1 to about 1:0.9.

In an exemplary embodiment, lengths of two opposing sides of a plurality of sides defining an edge of the opening on the plane are different from each other.

In an exemplary embodiment, the opening overlaps the first electrode, and the opening and the first electrode have a substantially identical shape on a plane.

In an exemplary embodiment, the opening overlaps the first electrode, and the opening and the first electrode have a different shape on a plane.

In an exemplary embodiment, the first electrode is linearly symmetric with respect to the imaginary straight line, and the opening is asymmetric with respect to the imaginary straight line.

In an exemplary embodiment, the first electrode has a rhombic shape on the plane.

In an exemplary embodiment, the conductive lines include a data line, a common power line, and a connection electrode.

In an exemplary embodiment, the organic light emission layer includes a red light emission layer, a green light emission layer, and a blue light emission layer.

In an exemplary embodiment, each of the red light emission layer and the blue light emission layer is divided into a first light emission portion and a second light emission portion with respect to the imaginary straight line, and a planar area of the first light emission portion is different from a planar area of the second light emission portion.

In an exemplary embodiment, the green light emission layer is divided into a first light emission portion and a second light emission portion with respect to the imaginary straight line, and a planar area of the first light emission portion is different from a planar area of the second light emission portion.

In an exemplary embodiment, each of a planar area of the red light emission layer and a planar area of the blue light emission layer is larger than a Planar area of the green light emission layer.

In an exemplary embodiment, the planar area of the red light emission layer is less than the planar area of the blue light emission layer.

In an exemplary embodiment, the red light emission layer and the blue light emission layer are arranged alternately in the first direction.

In an exemplary embodiment, the red light emission layer and the blue light emission layer are arranged alternately in a second direction that crosses the first direction.

In an exemplary embodiment, the imaginary straight line extends from a first vertex of the opening to a second vertex of the opening in the first direction, and the first vertex and the second vertex overlap a same one of the conductive lines.

In an exemplary embodiment, the same one of the conductive lines overlapped by the first vertex and the second vertex is a data line.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
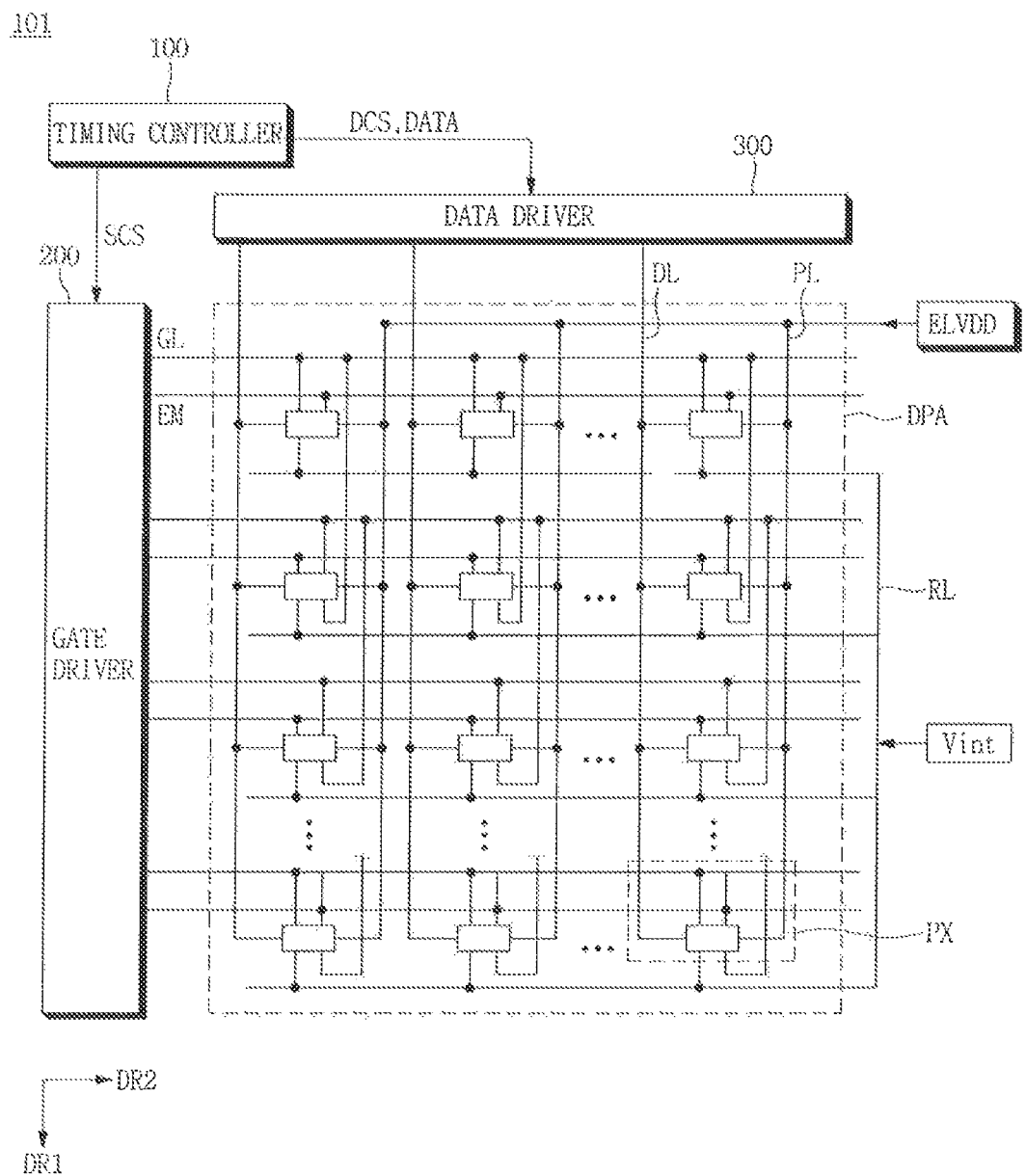
FIG. 1 is a block diagram illustrating an OLED display device according to an exemplary embodiment of the present invention.

Exemplary embodiments of the present invention will be described more fully hereinafter with reference to the accompanying drawings. Like reference numerals may refer to like elements throughout the accompanying drawings.

When a layer or area is referred to as being "on" another layer or area, it may be directly on the other layer or area, or intervening layers or areas may be present therebetween. Further when layer or area is referred to as being "below" another layer or area, it may be directly below the other layer or area, or intervening layers or areas may be present therebetween.

The spatially relative terms "below", "beneath", "lower", "above", "upper", etc. may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

It will be understood that, although the terms "first," "second," "third," etc. may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of ordinary skill in the art. Similarly, when two or more elements or values are described as being substantially the same as, identical, or about equal to each other, it is to be understood that the elements or values are identical to each other, indistinguishable from each other, or distinguishable from each other but functionally the same as each other as would be understood by one of ordinary skill in the art.

FIG. 1 is a block diagram illustrating an organic light emitting diode (OLED) display device according to an exemplary embodiment of the present invention.

Referring to FIG. 1, an OLED display device 101 according to an exemplary embodiment includes a timing controller 100, a gate driver 200, a data driver 300, and a display area DPA.

The timing controller 100 receives an input image signal from outside of the OLED display device 101, and generates image data DATA. In addition, the timing controller 100 outputs the image data DATA and various control signals, including a data control signal DCS and a gate control signal SCS.

The gate driver 200 receives the gate control signal SCS from the timing controller 100. The gate control signal SCS may include, for example, a vertical start signal used to start an operation of the gate driver 200, and a clock signal used to determine an output timing of the signals. The gate driver 200 generates a plurality of gate signals and sequentially outputs the plurality of gate signals to a plurality of gate lines GL. In addition, the gate driver 200 generates a plurality of emission control signals in response to the gate control signal SCS, and outputs the plurality of emission control signals to a plurality of emission control lines EM.

Referring to FIG. 1, it is illustrated that the plurality of gate signals and the plurality of emission control signals are output from one gate driver 200. However, exemplary embodiments of the present invention are not limited thereto. For example, in an exemplary embodiment, a plurality of gate drivers may divide and output a plurality of gate signals, and divide and output a plurality of emission control signals. In addition, in an exemplary embodiment, a driver that generates and outputs the plurality of gate signals, and a driver that generates and outputs the plurality of emission control signals may be separated.

The data driver 300 receives the data control signal DCS and the image data DATA from the timing controller 100. The data driver 300 converts the image data DATA into data signals and outputs the data signals to a plurality of data lines DL. A data signal is an analog voltage corresponding to a gray level value of the image data.

The plurality of gate lines GL, the plurality of emission control lines EM, the plurality of data lines DL, and a plurality of pixels PX are arranged in the display area DPA. The plurality of gate lines GL is arranged in a first direction DR1, and each of the plurality of gate lines GL extends along a second direction DR2 which crosses first direction DR1. Each of the plurality of emission control lines EM may be arranged in parallel to a corresponding one of the plurality of gate lines GL. The plurality of data lines DL is insulated from and intersects the plurality of gate lines GL.

Each of the plurality of pixels PX is connected to a gate line GL, an emission control line EM, and a data line DL. In addition, each pixel PX receives a first voltage ELVDD and a second voltage ELVSS (see FIG. 2). The voltage level of the second voltage ELVSS is less than a voltage level of the first voltage ELVDD. Each pixel PX includes a common power line EL that receives the first voltage ELVDD, and an initialization line RL that receives an initialization voltage Vint. The first voltage ELVDD may also referred to herein as a common voltage.

One pixel PX may be electrically connected to two gate lines GL. As illustrated in FIG. 1, pixels PX connected to a second gate line (hereinafter referred to as pixels of a second pixel row) may be connected to a first gate line. Accordingly, the pixels PX of the second pixel row receive a gate signal applied to the second gate line and a gate signal applied to the first gate line.

The pixel PX includes an OLED and a circuit portion that controls light emission of the OLED. The circuit portion may include a plurality of thin film transistors and a capacitor. The display area DPA may include a red pixel that emits a red light, a green pixel that emits a green light, and a blue pixel that emits a blue light. An OLED of the red pixel, an OLED of the green pixel, and an OLED of the blue pixel may respectively include organic light emission layers each including different materials.

The plurality of gate lines GL, the plurality of emission control lines the plurality of data lines DL, the common power line PL, the initialization line RL, and the plurality of pixels PX may be formed through a plurality of patterning processes. In addition, a plurality of insulating layers may be formed through a plurality of deposition or coating processes. Each insulating layer may include at least one of an organic layer and an inorganic layer.

Figure 2:
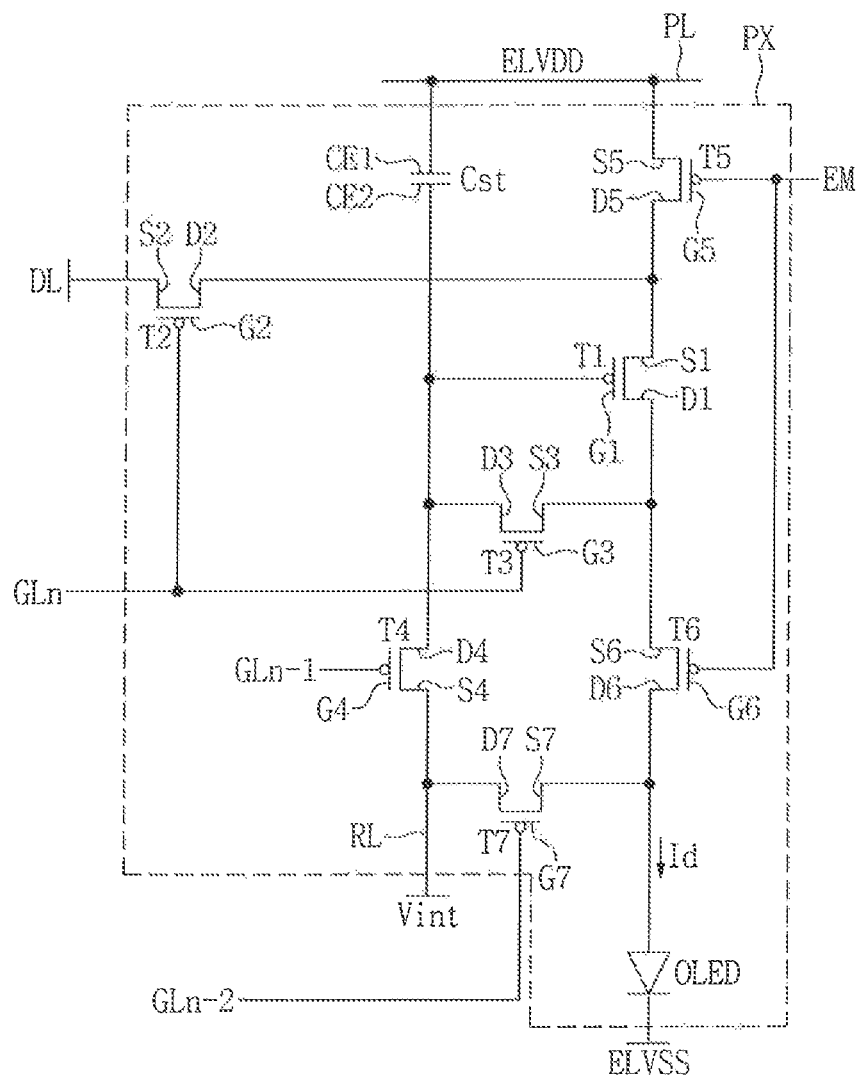
FIG. 2 is a circuit diagram illustrating one pixel of an OLED display device according to an exemplary embodiment of the present invention.

FIG. 2 is a circuit diagram illustrating one pixel of an OLED display device according to an exemplary embodiment of the present invention.

Referring to FIG. 2, one pixel PX of the OLED display device 101 according to an exemplary embodiment includes a plurality of thin film transistors T1, T2, T3, T4, T5, T6, and T7, a plurality of wirings GLn, GLn-1, GLn-2, EM, RL, DL, and PL connected to the plurality of thin film transistors T1, T2, T3, T4, T5, T6, and T7, a capacitor Cst, and an OLED.

The plurality of thin film transistors T1, T2, T3, T4, T5, T6, and T7 includes a first thin film transistor T1, a second thin film transistor T2, a third thin film transistor T3, a fourth thin film transistor T4, a fifth thin film transistor T5, a sixth thin film transistor T6, and a seventh thin film transistor T7.

A first gate electrode G1 of the first thin film transistor T1 is connected to a third drain electrode D3 of the third thin film transistor T3 and a fourth drain electrode D4 of the fourth thin film transistor T4. A first source electrode S1 of the first thin film transistor T1 is connected to a second drain electrode D2 of the second thin film transistor T2 and a fifth drain electrode D5 of the fifth thin film transistor T5. A first drain electrode D1 of the first thin film transistor T1 is connected to a third source electrode S3 of the third thin film transistor T3 and a sixth source electrode S6 of the sixth thin film transistor T6.

A second gate electrode G2 of the second thin film transistor T2 is connected to a first gate line GLn, a second source electrode S2 of the second thin film transistor T2 is connected to a data line DL, and the second drain electrode D2 of the second thin film transistor T2 is connected to the first source electrode S1 of the first thin film transistor T1.

A third gate electrode G3 of the third thin film transistor T3 is connected to the first gate line GLn, the third source electrode S3 of the third thin film transistor T3 is connected to the first drain electrode D1 of the first thin film transistor T1, and the third drain electrode D3 of the third thin film transistor T3 is connected to the first gate electrode G1 of the first thin film transistor T1.

A fourth gate electrode G4 of the fourth thin film transistor T4 is connected to a second gate line GLn-1, a fourth source electrode S4 of the fourth thin film transistor T4 is connected to an initialization line RL, and the fourth drain electrode D4 is connected to the first gate electrode G1 of the first thin film transistor T1. An initialization voltage Vint is applied through the initialization line RL.

A fifth gate electrode G5 of the fifth thin film transistor T5 is connected to an emission control line EM, a fifth source electrode S5 of the fifth thin film transistor T5 is connected to a common power line PL, and the fifth drain electrode D5 of the fifth thin film transistor T5 is connected to the first source electrode S1 of the first thin film transistor T1.

A sixth gate electrode G6 of the sixth thin film transistor T6 is connected to the emission control line EM, and the sixth source electrode S6 of the sixth thin film transistor T6 is connected to the first drain electrode D1 of the first thin film transistor T1.

A seventh gate electrode G7 of the seventh thin film transistor T7 is connected to a third gate line GLn-2, a seventh source electrode S7 of the seventh thin film transistor T7 is connected to the OLED, and a seventh drain electrode D7 of the seventh thin film transistor T7 is connected to the fourth source electrode S4 of the fourth thin film transistor T4.

Thus, signal lines for transmitting gate signals include the first gate line GLn that transmits a first gate signal to each of the second gate electrode G2 and the third gate electrode G3 the second gate line GLn-1 that transmits a second gate signal to the fourth gate electrode G4, the third gate line GLn-2 that transmits a third gate signal to the seventh gate electrode G7, and the emission control line EM that transmits a light emission control signal to each of the fifth gate electrode G5 and the sixth gate electrodes G6.

The capacitor Cst includes a first electrode CE1 connected to the common power line PL, and a second electrode CE2 connected to the first gate electrode G1 of the first thin film transistor T1 and the third drain electrode D3 of the third thin film transistor T3.

The OLED includes a first electrode 171, a second electrode 173 disposed on the first electrode 171, and an organic light emission layer 172 disposed between the first electrode 171 and the second electrode 173 (see FIG. 5), which will be described in further detail below. The first electrode 171 of the OLED is connected to the seventh source electrode S7 of the seventh thin film transistor 17 and a sixth drain electrode D6 of the sixth thin film transistor T6. The second voltage ELVSS is applied through the second electrode 173.

Hereinafter, an operation of the pixel PX will be described by way of example.

First, when the third gate signal is transmitted to the third gate line GLn-2 and the seventh thin film transistor 17 is turned on, a residual current flowing through the first electrode 171 of the OLED is discharged to the fourth thin film transistor T4 through the seventh thin film transistor T7 such that unintended light emission due to the residual current flowing through the first electrode 171 of the OLED is suppressed.

Next, when the second gate signal is transmitted to the second gate line GLn-1 and the initialization signal is transmitted to the initialization line RL, the fourth thin film transistor T4 is turned on and the initialization voltage Vint based on the initialization signal is applied to the first gate electrode G1 of the first thin film transistor T1 and the second electrode CE2 of the capacitor Cst through the fourth thin film transistor T4, such that the first gate electrode G1 and the capacitor Cst are initialized. In this example, the first gate electrode G1 is initialized and the first thin film transistor T1 is turned on.

Subsequently, when the first gate signal is transmitted to the first gate line GLn and the data signal is transmitted to the data line DL, each of the second thin film transistor T2 and the third thin film transistor T3 is turned on and a data voltage Vd based on the data signal is applied to the first gate electrode G1 through the second thin film transistor T2, the first thin film transistor T1, and the third thin film transistor T3.

In this example, a voltage applied to the first gate electrode G1 is a compensation voltage Vd+Vth, Vth having a value of (−), which is obtained by subtracting a threshold voltage Vth of the first thin film transistor T1 from the data voltage Vd applied from an initial data line DL. The compensation voltage Vd+Vth, which is applied to the first gate electrode G1, is also applied to the second electrode CE2 of the capacitor Cst connected to the first gate electrode G1.

Next, a driving voltage Ve1 based on a driving signal is applied from the common power line PL to the first electrode CE1 of the capacitor CA and the compensation voltage Vd+Vth is applied to the second electrode CE2, such that electric charges corresponding to a difference between voltages respectively applied to both electrodes of the capacitor Cst is stored in the capacitor Cst, and the first thin film transistor T1 is turned on for a predetermined amount of time.

Next, when the emission control signal is applied to the emission control line EM, each of the fifth thin film transistor T5 and the sixth thin film transistor T6 is turned on, such that the driving voltage Ve1 based on the driving signal from the common power line PL is applied to the first thin film transistor T1 through the fifth thin film transistor T5.

In this example, as the driving voltage Ve1 passes through the first thin film transistor T1 which is turned on by the capacitor Cst, a driving current Id corresponding to a difference between the driving voltage Ve1 and a voltage applied to the first gate electrode G1 by the capacitor Cst flows through the first drain electrode D1 of die first thin film transistor T1, and the driving current Id is applied to the OLED through the sixth thin film transistor T6 such that the OLED emits light for a predetermined amount of time.

It is to be understood that the configuration of the pixel PX of the OLED display device 101 according to an exemplary embodiment as described above is not limited thereto. For example, in an exemplary embodiment, the pixel PX of the OLED display device 101 may include wirings of a plurality of thin film transistors, one or more capacitors, one or more gate lines, and one or more driving power lines.

Figure 3:
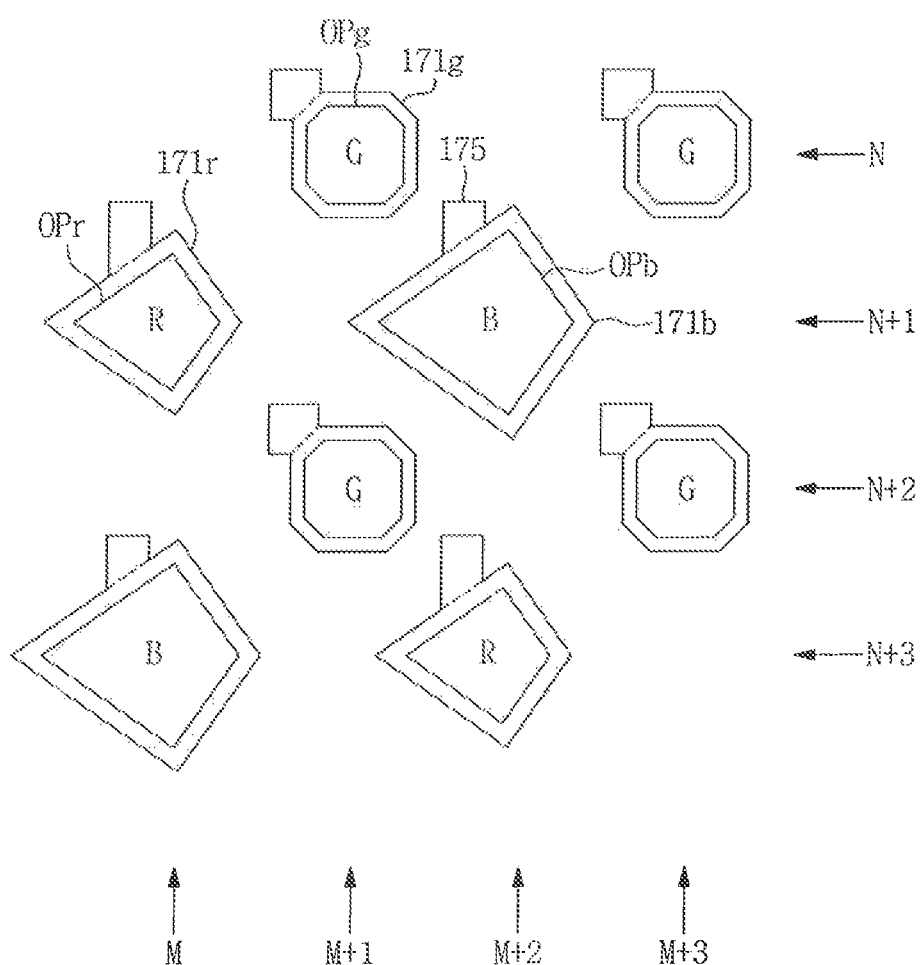
FIG. 3 is a schematic plan view illustrating a plurality of first electrodes and a plurality of openings of an OLED display device according to an exemplary embodiment of the present invention.

FIG. 3 is a schematic plan view illustrating a plurality of first electrodes and a plurality of openings of an OLED display device according to an exemplary embodiment of the present invention.

Referring to FIG. 3, the OLED display device 101 according to an exemplary embodiment includes a plurality of first electrodes 171r, 171g, and 171b corresponding to a plurality of pixels PX, and a plurality of openings OPr, Opg, and Opb defined by a pixel defining layer 190 (e.g., included in the pixel defining layer 190), as described further below. In an exemplary embodiment, the plurality of openings Opr, Opg, and Opb defines a light emission area of the OLED. The light emission area may also be referred to herein as a pixel area. The plurality of pixels PX includes a red pixel that emits a red light, a green pixel that emits a green light, and a blue pixel that emits a blue light. In an exemplary embodiment, a red OLED of the red pixel includes a red light emission layer, a green OLED of the green pixel includes a green light emission layer, and a blue OLED of the blue pixel includes a blue light emission layer.

The OLED display device 101 according to an exemplary embodiment may have a PENTILE structure. For example, as illustrated in FIG. 3, a plurality of first electrodes 171g corresponding to the green light emission layer is arranged in an N-th row, the first electrodes 171g in the N-th row are spaced, apart from one another, and a first electrode 171r corresponding to the red light emission layer and a first electrode 171b corresponding to the blue light emission layer are alternately disposed in an adjacent (N+1)-th row. Similarly, a plurality of first electrodes 171g corresponding to the green light emission layer is arranged in an adjacent (N+2)-th row, the first electrodes 171g in the (N+2)-th row are spaced apart from one another, and a first electrode 171b corresponding to the blue light emission layer and a first electrode 171r corresponding to the red light emission layer are alternately disposed in an adjacent (N+3)-th row.

In an exemplary embodiment, the first electrodes 171g corresponding to the green light emission layer arranged in the N-th row are staggered with the first electrodes 171r and 171b corresponding to the red and blue light emission layers arranged in the (N+1)-th row. For example, in an exemplary embodiment, the first electrodes 171g are not aligned with the first electrodes 171r and 171b (e.g., the first electrodes 171g are offset relative to the first electrodes 171r and 171b). For example, the first electrodes 171r and 171b corresponding to the red and blue light emission layers are arranged alternately in an M-th column, and the first electrodes 171g corresponding to the green light emission layer are spaced apart from one another and arranged in an adjacent (M+1)-th column. Similarly, the first electrodes 171r and 171b corresponding to the red and blue light emission layers are alternately disposed in an adjacent (M+2)-th column, and the first electrodes 171g corresponding to the green light emission layer are spaced apart from one another and arranged in an adjacent (M+3)-th column. The plurality of first electrodes 171r, 171g, and 171b may be arranged repeatedly in the above-described structure.

The OLED display device 101 according to an exemplary embodiment may further include a connection electrode 175 protruding from each of the plurality of first electrodes 171r, 171g, and 171b. The plurality of first electrodes 171r, 171g and 171b may be connected to the seventh source electrode S7 of the seventh thin film transistor T7 and the sixth drain electrode D6 of the sixth thin film transistor T6 through the connection electrode 175. The plurality of first electrodes 171r, 171g, and 171b and the connection electrode 175 may be manufactured through a substantially same process using a substantially same material.

The plurality of openings Opr, Opg, and Opb expose at least a part of the plurality of first electrodes 171r, 171g, and 171b. In an exemplary embodiment, the plurality of openings Opr, Opg and Opb may be defined by the pixel defining layer 190, which is described below, and the plurality of openings Opr, Opg and Opb may correspond to the red light emission layer, the green light emission layer, and the blue light emission layer, respectively. In addition, the plurality of openings Opr, Opg, and Opb may correspond to the plurality of first electrodes 171r 171g, and 171b, respectively.

In an exemplary embodiment, the shape of each opening Opr, Opg, and Opb is substantially identical to a shape of each corresponding first electrode 171r, 171g, and 171b on a plane, as shown in FIG. 3. For example, the first electrodes 171r and 171b and the openings Opr and Opb corresponding to the red and blue light emission layers may each have a quadrilateral shape on a plane, and the first electrode 171g and the opening Opg corresponding to the green light emission layer may have an octagonal shape on a plane. However, exemplary embodiments are not limited thereto. For example, the plurality of first electrodes 171r, 171g, and 171b and the plurality of openings Opr, Opg, and Opb may have various shapes such as a pentagon, a hexagon, etc. The shapes of the plurality of first electrodes 171r, 171g, and 171b and the plurality of openings Opr, Opg, and Opb according to exemplary embodiments will be described further below.

In an exemplary embodiment, each of planar areas of the red light emission layer and the blue light emission layer according is larger than a planar area of the green light emission layer, as shown in FIG. 3. In addition, in an exemplary embodiment, the planar area of the red light emission layer is less than the planar area of the blue light emission layer, as shown in FIG. 3.

For example, as illustrated in FIG. 3, in an exemplary embodiment, the opening Opb corresponding to the blue light emission layer is larger than the openings Opr and Opg respectively corresponding to the red and green light emission layers on a plane. In addition, the opening Opr corresponding to the red light emission layer is larger than the opening Opg corresponding to the green light emission layer on a plane. Similarly, the first electrode 171b corresponding to the blue light emission layer has a planar area larger than a planar area of each of the first electrodes 171r and 171g corresponding to the red and green light emission layers on a plane. In addition, the first electrode 171r corresponding to the red light emission layer has a planar area larger than a planar area of the first electrode 171g, corresponding to the green light emission layer on a plane. It is to be understood that exemplary embodiments of the present invention are not limited to the sizes illustrated in FIG. 3.

Figure 4:
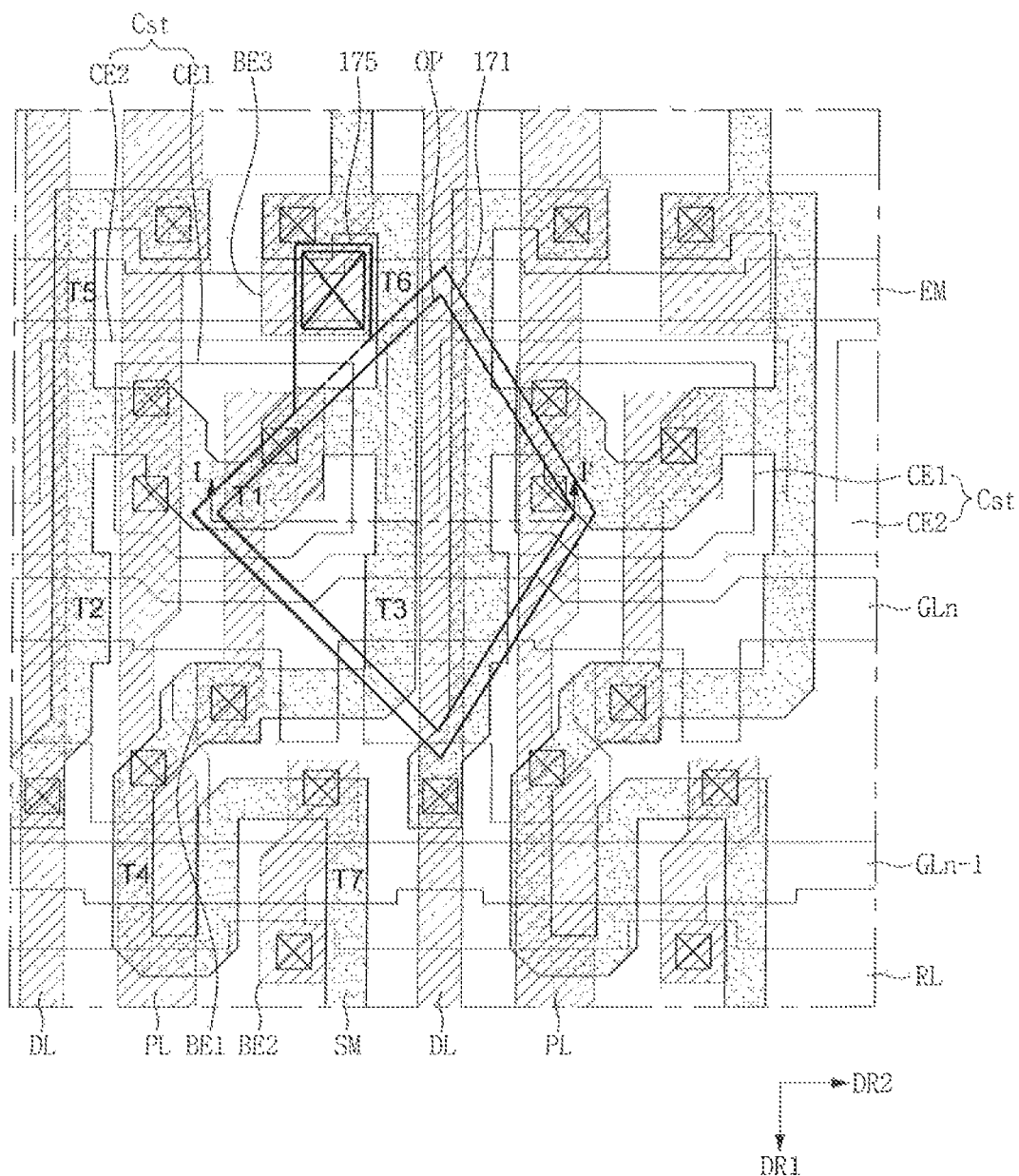
FIG. 4 is a schematic layout diagram illustrating one pixel of an OLED display according to an exemplary embodiment of the present invention.
Figure 5:
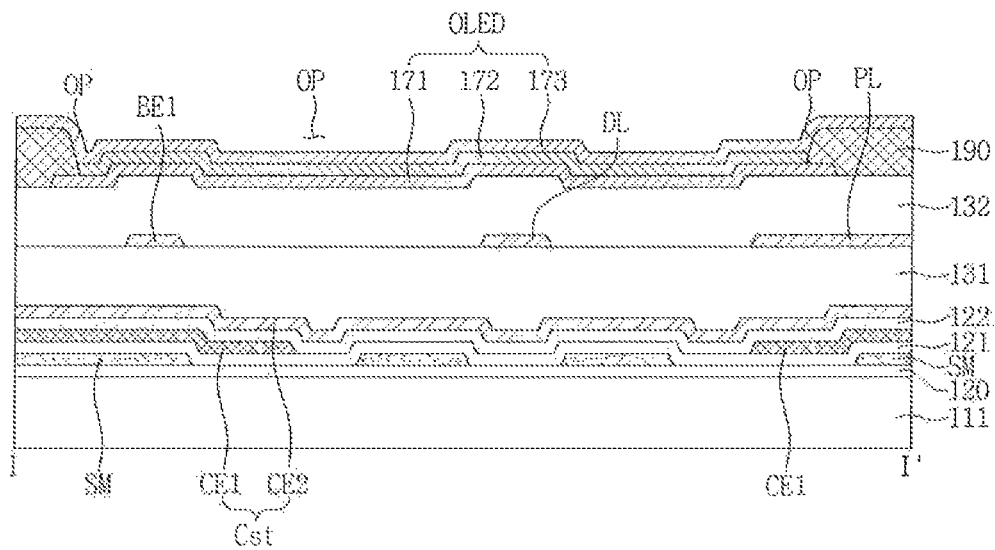
FIG. 5 is a cross-sectional view taken along line I-I' of FIG. 4 according to an exemplary embodiment of the present invention.

FIG. 4 is a schematic layout diagram illustrating one pixel of an OLED display according to an exemplary embodiment of the present invention. FIG. 5 is a cross-sectional view taken along line I-I' of FIG. 4 according to an exemplary embodiment of the present invention.

Referring to FIGS. 4 and 5, the OLED display device 101 according to an exemplary embodiment includes a plurality of thin film transistors T1 T2, T3, T4, T5, T6, and T7 and an OLED disposed on a substrate 111.

The substrate 111 may be formed using a variety of materials. For example, the substrate 111 may include an insulating material such as glass, plastic, quartz, etc. However, the substrate 111 is not limited thereto. The material that forms the substrate 111 may be selected, for example, from materials which, are excellent in mechanical strength, thermal stability, transparency, surface smoothness, ease of handling, water, resistance, etc.

A buffer layer 120 is disposed on the substrate 111. The buffer layer 120 substantially prevents impurities from diffusing into the plurality of thin film transistors T1, T2, T3, T4, T5, T6, and T7.

A semiconductor layer SM is disposed on the buffer layer 120. The semiconductor layer SM includes a semiconductor material and serves as an active layer of each of the plurality of thin film transistors T1, T2, T3, T4, T5, T6, and T7. The semiconductor layer SM may include a source area, a drain area, and a channel area disposed between the source area and the drain area.

The semiconductor layer SM may include, for example, amorphous silicon or polycrystalline silicon, or may include, for example, an oxide semiconductor. For example, the semiconductor layer SM may include an inorganic semiconductor material or an organic semiconductor material. In addition, the source area and the drain area may be doped with an n-type impurity or a p-type impurity.

A gate insulating layer 121 is disposed on the semiconductor layer SM. The gate insulating layer 121 protects the semiconductor layer SM. The gate insulating layer 121 may include an organic insulating material or an inorganic insulating material.

The first electrode CE1 of the capacitor Cst, the plurality of gate lines GLn and GLn−1, and the plurality of emission control lines EM, may be collectively referred to as a conductive pattern. The conductive pattern formed by CE1, GLn, GLn−1, and EM is disposed on the gate insulating layer 121. In an exemplary embodiment, the conductive pattern formed by CE1, GLn, GLn−1, and EM includes a plurality of gate electrodes protruding from the plurality of gate lines GLn and GLn−1. The conductive pattern formed by CE1, GLn, GLn−1, and EM may be manufactured in a substantially same process using a substantially same material.

An insulating interlayer 122 is disposed on the conductive pattern formed by CE1, GLn, GLn−1, and EM. The insulating interlayer 122 may include an organic insulating material or an inorganic insulating material.

The second electrode CE2 of the capacitor Cst, the initialization line RL, and a plurality of connection patterns CN are disposed on the insulating interlayer 122. The second electrode CE2 of the capacitor Cst, the initialization line RL, and the plurality of connection patterns CN may be manufactured in a substantially same process using a substantially same material.

A first protection layer 131 is disposed on the second electrode CE2 of the capacitor Cst, the initialization line RL, and the plurality of connection patterns CN. The first protection layer 131 protects the plurality of thin film transistors T1, T2, T3, T4, T5, T6, and T7, and is also used to planarize upper surfaces thereof.

In an exemplary embodiment, the first protection layer 131 includes a photosensitive material. For example, the first protection layer 131 may include a photosensitive polymer resin.

The plurality of data lines DL, the plurality of common power lines PL, and first, second, and third connection electrodes BE1, BE2, and BE3 are each a conductive line, and may be referred to herein as conductive lines. As shown in FIG. 4, the conductive lines DL, PL, BE1, BE2, and BE3 extend substantially in the first direction DR1 (e.g., extend lengthwise in the first direction DR1). The conductive lines DL, PL, BE1, BE2, and BE3 are disposed on the first protection layer 131. In an exemplary embodiment, the conductive lines DL, PL, BE1, BE2, and BE3 may include a plurality of source and drain electrodes. The drain electrode may contact the drain area of the semiconductor layer SM through at least one contact hole defined at the gate insulating layer 121, the insulating interlayer 122, and the first protection layer 131. The source electrode may contact the source area of the semiconductor layer SM through at least one other contact hole defined at the gate insulating layer 121, the insulating interlayer 122, and the first protection layer 131.

The conductive lines DL, PL, BE1, BE2 and BE3 may be manufactured through a substantially same process using a substantially same material. For example, the conductive lines DL, PL, BE1, BE2, and BE3 may include or be formed of aluminum (Al) or alloys thereof, silver (Ag) or alloys thereof copper (Cu) or alloys thereof, molybdenum (Mo) or alloys thereof, chromium (Cr), tantalum (Ta), and/or titanium (Ti). In an exemplary embodiment, the conductive lines DL, PL, BE1, BE2, and BE3 may have a multilayer structure including a refractory metal layer and a low-resistance conductive layer. As such, the conductive lines DL, PL, BE1, BE2, and BE3 include a conductive material.

A second protection layer 132 is disposed on the conductive lines DL, PL, BE1, BE2, and BE3. According to an exemplary embodiment, the second protection layer 132 may include a photosensitive material. For example, the second protection layer 132 may include a photosensitive polymer resin.

The second protection layer 132 protects the conductive lines DE, PL, BE1, BE2, and BE3, and is also used to planarize upper surfaces thereof. However, when the conductive lines DL, PL, BE2, BE2 and BE3 are thick, an upper portion of the conductive lines DL, PL, BE1, BE2 and BE3 may not be completely planarized by the second protection layer 132.

As OLED display technology advances due to integration of wirings, an increased amount of current or data is transmitted with a wiring having a small planar area. Accordingly, the thickness of the wiring becomes thick. When the conductive lines DL, PL, BE1, BE2 and BE3 become thick, even if the second protection layer 132 is disposed on the upper portion of the conductive lines DL, PL, BE1, BE2 and BE3, the upper portion thereof may not be completely planarized.

Thus, according to an exemplary embodiment, the OLED display device 101 includes a plurality of openings OP, each opening OP having an asymmetrical shape on a plane such that an overlap area between overlapped conductive lines from among the conductive lines DL, PL, BE1, BE2, and BE3 below the second protection layer 132 and the opening OP is configured in a manner to alleviate step difference unbalance or asymmetry due to the conductive lines DL, PL, BE1, BE2 and BE3, as described in detail below.

The that electrode 171 is disposed on the second protection layer 132. In an exemplary embodiment, the first electrode 171 overlaps at least a part of the conductive lines DL, PL, BE1, BE2, and BE3.

The first electrode 171 may be a pixel electrode, and may be an anode. The first electrode 171 has conductivity, and may be a transmissive electrode, a transflective electrode, or a reflective electrode. When the first electrode 171 is a transmissive electrode, the first electrode 171 includes a transparent conductive oxide. The transparent conductive oxide may include, for example, at least one of indium tin oxide (ITO), indium zinc oxide (IZO), zinc oxide (ZnO), and indium tin zinc oxide (ITZO). When the first electrode 171 is a transflective electrode or a reflective electrode, the first electrode 171 may include at least one of Ag, Mg, Al, Pt, Pd, Au, Ni, Nd, Ir, Cr, and Cu.

According to an exemplary embodiment, the OLED display device 101 further includes a connection electrode 175 protruding from the first electrode 171. In an exemplary embodiment, the connection electrode 175 is connected to the third connection electrode BE3 through a contact hole defined at the second protection layer 132. The first electrode 171 and the connection electrode 175 may be manufactured through a substantially same process using a substantially same material.

The pixel defining layer 190 divides the light emission area and is disposed on the second protection layer 132.

The pixel defining layer 190 may include a polymer organic material. The pixel defining layer 190 may include at least one of, for example, a polyimide (PI) resin, a polyacrylic resin, a PET resin, and a PEN resin.

The pixel defining layer 190 defines the plurality of opening OP (e.g., the plurality of openings OP is included in the pixel defining layer 190), and at least a portion of the first electrode 171 is exposed from the pixel defining layer 190 through each of the openings OP. For example, the first electrode 171 overlaps at least a part of the pixel defining layer 190, and does not overlap the pixel defining layer 190 at the opening 195. In addition, according to exemplary embodiments, the light emission area of the OLED is defined by the opening OP.

The organic light emission layer 172 is disposed on the first electrode 171. For example, the organic light emission layer 172 is disposed on the first electrode 171 at the opening OP. In an exemplary embodiment, the organic light emission layer 172 is disposed on a sidewall of the opening OP defined by the pixel defining layer 190 and on the pixel defining layer 190.

The organic light emission layer 172 includes a light emitting material. In addition, the organic light emission layer 172 may include a host and a light emitting dopant. The organic light emission layer 172 may be thrilled through various methods such as, for example, a vacuum deposition method, a spin coating method, a cast method, a langmuir-blodgett (LB) method, an inkjet printing method, a laser printing method, a laser induced thermal imaging (LITI) method, etc.

At least one of a hole injection layer (HIL) and a hole transport layer (HTL) may be disposed between the first electrode 171 and the organic light emission layer 172.

The second electrode 173 is disposed on the organic light emission layer 172.

The second electrode 173 may be a common electrode, and may be a cathode. The second electrode 173 may be a transmissive electrode, a transflective electrode, or a reflective electrode.

When the second electrode 173 is a transmissive electrode, the second electrode 173 may include at least one of Li, Ca, LiF/Ca LiF/Al, Al, Mg, BaF, Ba, Ag, and Cu. For example, the second electrode 173 may include a mixture of Ag and Mg.

When the second electrode 173 is a transflective electrode or a reflective electrode, the second electrode 173 may include at least one of Ag, Mg, Al, Pt, Pd, Au, Ni, Nd, Ir, Cr, Li, Ca, LiF/Ca, LiF/Al, Mo, Ti, and Cu. In addition, the second electrode 173 may further include a transparent conductive layer including, for example, indium tin oxide (ITO), indium zinc oxide (IZO), zinc oxide (ZnO), and indium-zinc-tin oxide (IZTO), in addition to the transflective electrode or the reflective electrode.

At least one of an electron transport layer (ETL) and an electron injection layer (EIL) may be disposed between the organic light emission layer 172 and the second electrode 173.

When the OLED is a top emission type OLED, the first electrode 171 may be a reflective electrode and the second electrode 173 may be a transmissive electrode or a transflective electrode. When the OLED 170 is a bottom emission type OLED, the first electrode 171 may be a transmissive electrode or a transflective electrode, and the second electrode 173 may be a reflective electrode.

Figure 6:
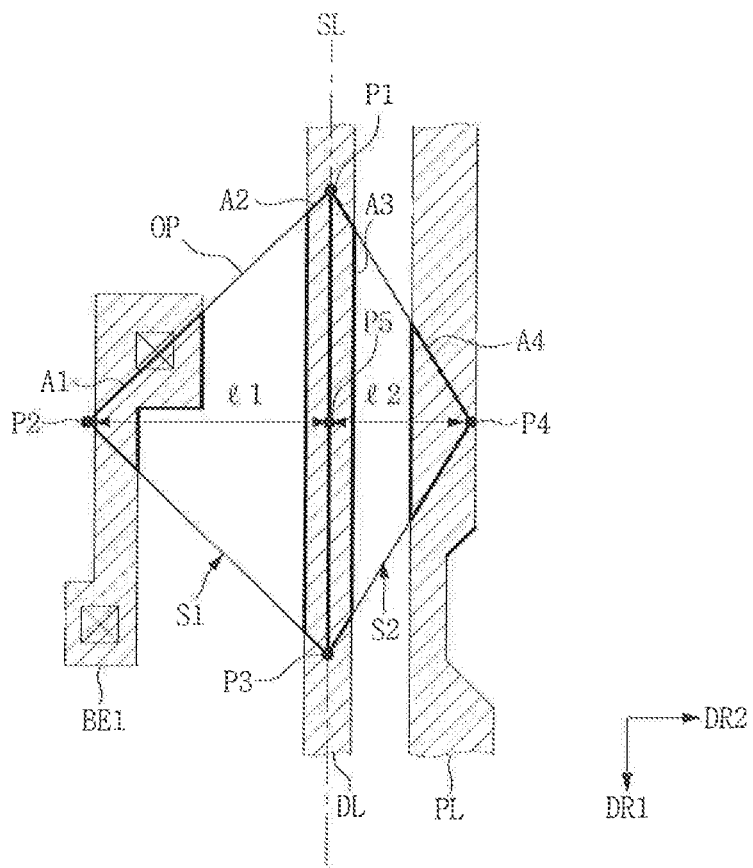
FIG. 6 is a plan view illustrating only conductive lines and an opening of an OLED display device according to an exemplary embodiment of the present invention.

FIG. 6 is a plan view illustrating only conductive lines and an opening of an OLED display device according to an exemplary embodiment.

Referring to FIG. 6, for convenience of illustration, only conductive lines BE1, DL, and PL and an opening OP are shown. As shown in FIG. 6, according to an exemplary embodiment, an opening OP is divided into a first polygon and a second polygon with respect to a first imaginary straight line SL extending in the first direction DR1. The first imaginary straight line SL extends substantially parallel to the conductive lines DL, PL, BE1, BE2, and BE3. The first imaginary straight line SL passes through the opening OP at a maximum length in the first direction DR1. The opening OP on a plane may be divided into a first region S1 having a first triangular shape and a second region S2 having second triangular shape with respect to the first imaginary straight line SL. The first region S1 corresponds to the first polygon and the second region S2 corresponds to the second polygon. Although the first and second regions S1 and S2 illustrated in FIG. 6 have triangular shapes, exemplary embodiments of the present invention are not limited thereto.

In an exemplary embodiment, the first region S1 has a planar area different from a planar area of the second region S2. For example, as illustrated in FIG. 6, when the opening OP according to an exemplary embodiment has a quadrilateral shape on a plane and vertices of the quadrilateral are respectively defined as first, second, third, and fourth vertices P1, P2, P3, and P4, a distance l1 from a midpoint P5 between the first and third vertices P1 and P3 which face each other in the first direction DR1 to the second vertex P2 is greater than a distance l2 from the midpoint P5 between the first and third vertices P1 and P3 to the fourth vertex P4. That is, the planar area of the first region S1 is larger than the planar area of the second region S2. For example, the opening OP formed by the first and second regions S1 and S2 is asymmetrical with respect to the first imaginary straight line. In an exemplary embodiment, an area ratio of the first region S1 to the second region S2 is in a range from about 1:0.1 to about 1:0.9.

Accordingly, the opening OP has an asymmetrical shape on a plane. For example, the opening OP may have a left-right asymmetrical shape with respect to the first imaginary straight line SL on a plane. For example, referring to FIG. 6, in an exemplary embodiment, the opening OP is symmetrical relative to an imaginary line extending from vertex P2 to vertex P4 in the second direction DR2 on a plane, and is asymmetrical with respect to an imaginary line (e.g., the first imaginary straight line SL) extending from vertex P1 to P3 in the first direction DR1 on a plane. That is, lengths of two opposing sides of a plurality of sides defining an edge of the opening OP on the plane may be different from each other.

The opening OP according to an exemplary embodiment overlaps at least a part of the conductive lines DL, PL, BE1, BE2, and BE3. For example, as illustrated in FIG. 6, in an exemplary embodiment, the opening OP overlaps portions of the data line DL, the common power line PL, and the first connection electrode BE1 from among the conductive lines DL, PL, BE1, BE2, and BE3.

Exemplary embodiments of the present invention provide an OLED display device 101 having asymmetrical openings OP that overlap the conductive lines DL, PL, BE1, BE2, and BE3 in a configuration that reduces or prevents color shift based on the viewing angle of the OLED display device 101. For example, in an exemplary embodiment, a ratio of an overlap area between the first region S1 of the opening OP and the overlapped conductive lines from among conductive lines DL, PL, BE1, BE2 and BE3 to an overlap area between the second region S2 of the opening OP and the overlapped conductive lines from among conductive lines DL, PL, BE1, BE2 and BE3 is in a range from about 1:0.8 to about 1:1.2. Configuring an asymmetrical opening OP having such an overlap ratio reduces or prevents color shift based on the viewing angle of the OLED display device 101. According to an exemplary embodiment, the overlap area of the first region S2 with the overlapped conductive lines is substantially equal to the overlap area of the second region S2 with the overlapped conductive lines (e.g., the overlap ration is about 1:1). Configuring an asymmetrical opening OP having such an overlap ratio reduces or prevents color shill based on the viewing angle of the OLED display device 101.

For example, as illustrated in FIG. 6, in an exemplary embodiment, when, an overlap area between the first region S1 and the first connection electrode BE1 is defined as a first area A1, an overlap area between the first region S1 and the data line DL is defined as a second area A2, an overlap area between the second region S2 and the data line DL is defined as a third area. A3, and an overlap area between the second region S2 and the common power line PL is defined as a fourth area A4, a sum A1+A2 of the first area A1 and the second area A2 is substantially equal to a sum A3+A4 of the third area A3 and the fourth area A4.

Thus, according to exemplary embodiments of the present invention, step difference unbalance or asymmetry due to the conductive lines DL, PL, BE1, BE2 and BE3 overlapping the opening OP may be alleviated.

Referring to FIG. 6, according to an exemplary embodiment of the present invention, the opening OP is divided into a first polygon (e.g., region S1) and a second polygon (e.g., region S2) with respect to the first imaginary straight line (SL) extending from a first vertex (e.g., vertex P1) of the opening OP to a second vertex (e.g., vertex P3) of the opening OP in the first direction DR1. A planar area of the first polygon (e.g., region S1) is different from a planar area of the second polygon (e.g., region S2) (e.g., the opening OP is asymmetrical with respect to the first imaginary straight line (SL)). An overlap area between the first polygon (e.g., region S1) and the overlapped conductive lines (e.g., first area A1 and second area A2) and an overlap area between the second polygon (e.g., region S2) and the overlapped conductive lines (e.g., third area A3 and fourth area A4) have a ratio in a range from about 1:0.8 to about 1:1.2, or are substantially equal to each other e.g., have a ratio that is about 1:1). The first vertex vertex P1) and the second vertex (e.g., vertex P3) may overlap a same one of the conductive lines (e.g., the data line DL).

Referring to FIG. 6, according to an exemplary embodiment of the present application, the opening OP is divided into a first polygon (e.g., region S1) and a second polygon (e.g., region S2) with respect to a same one of the conductive lines (e.g., the data line DL), and a planar area of the first polygon (e.g., region S1) is different from a planar area of the second polygon (e.g., region S2) (e.g., the opening OP is asymmetrical with respect to the data line DL). An overlap area between the first polygon region S1) and the overlapped conductive lines (e.g., first area A1 and second area A2) and an overlap area between the second polygon (e.g., region S2) and the overlapped conductive lines e.g., third area A3 and fourth area A4) have a ratio in a range from about 1:0.8 to about 1:1.2, or are substantially equal to each other (e.g., have a ratio that is about 1:1).

In addition, as described above, the organic light emission layer 172 is disposed on the first electrode 171 at the opening OP, and the organic light emission layer 172 may have a shape substantially identical to a shape of the opening OP on a plane. The organic light emission layer 172 at the opening OP may be divided into a first light emission portion and a second light emission portion with respect to the first imaginary straight line SL. In an exemplary embodiment, the first light emission portion corresponds to the first region S1, and the second light emission portion corresponds to the second region S2. Accordingly, a planar area of the first light emission portion is larger than a planar area of the second light emission portion. For example, in an exemplary embodiment, an area ratio of the first light emission portion to the second light emission portion is in a range from about 1:0.1 to about 1:0.9.

Figure 7:
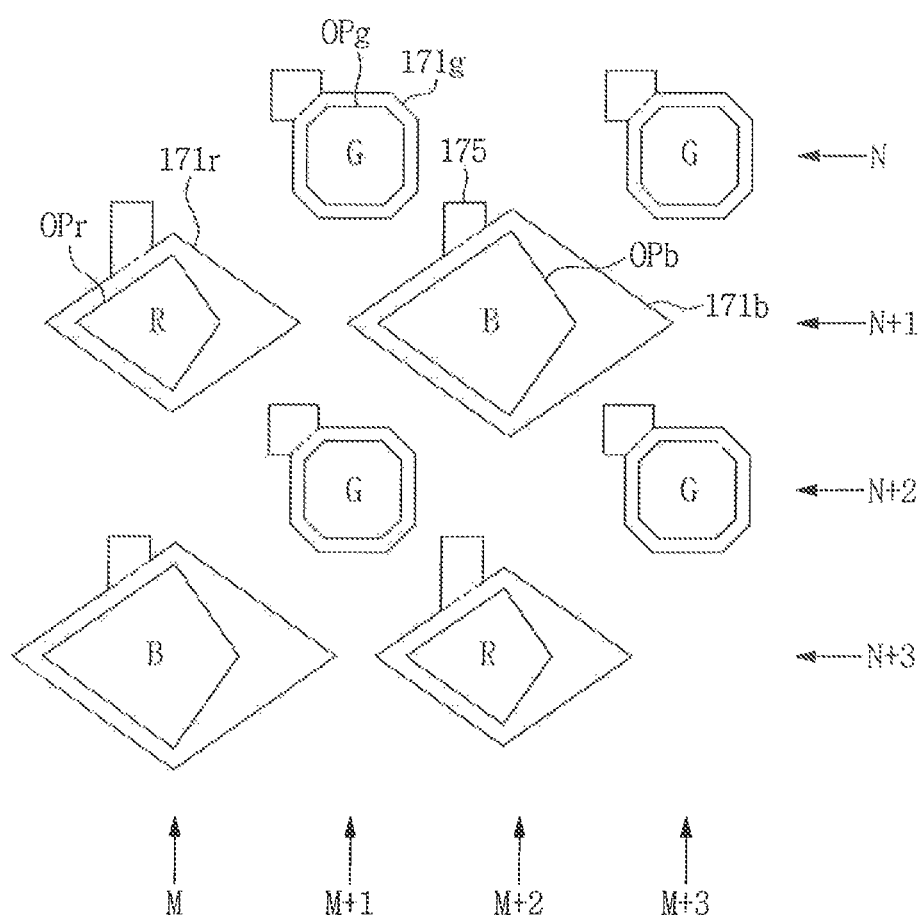
FIG. 7 is a schematic plan view illustrating a plurality of first electrodes and a plurality of openings of an OLED display device according to an exemplary embodiment of the present invention.

FIG. 7 is a schematic plan view illustrating a plurality of first electrodes and a plurality of openings of an OLED display device according to an exemplary embodiment of the present invention.

Referring to FIG. 7, in an exemplary embodiment, at least one of a plurality of openings OPr, OPg, and OPb has a shape different from a shape of each corresponding one of a plurality of first electrodes 171r, 171g, and 171b on a plane. For example, as illustrated in FIG. 7, the first electrodes 171r and 171b respectively corresponding to red and blue light emission layers have shapes different from a shape of each corresponding one of the openings OPr and OPb on a plane.

The first electrodes 171r and 171b corresponding to the red and blue light emission layers may have a rhombic shape. For example, in an exemplary embodiment, the first electrodes 171r and 171b corresponding to the red and blue light emission layers have a symmetrical shape on a plane. For example, each of the first electrodes 171r and 171b may be bisected on a plane with respect to an imaginary straight line connecting facing vertices of the first electrodes 171r and 171b, respectively.

Unlike the first electrodes 171r and 171b, the openings OPr and OPb in the exemplary embodiment shown in FIG. 7 have an asymmetrical shape on a plane. The pixel defining layer 190 defines the plurality of openings OPr and OPb, and at least a part of the first electrodes 171r and 171b is exposed from the pixel defining layer 190 through the openings OPr and OPb. In the exemplary embodiment shown in FIG. 7, the pixel defining layer 190 may be disposed so as to overlap at least a part of the first electrodes 171r and 171b so that the openings OPr and OPb have asymmetrical shapes on a plane.

Accordingly, unlike the first electrodes 171r and 171b, the openings OPr and OPb may have an asymmetrical shape on a plane, and step difference unbalance or asymmetry due to the conductive lines DL, PL, BE1, BE2 and BE3 overlapping the openings OPr and OPb may be alleviated.

Thus, as shown in FIG. 7, in an exemplary embodiment, each of the first electrodes 171r and 171b is linearly symmetric with respect to an imaginary straight line extending from a first vertex of the first electrode 171r/171b to a second vertex of the first electrode 171r/171b in a first direction (e.g., a vertical direction in FIG. 7), and the corresponding opening OPr/OPb is asymmetric with respect to the imaginary straight line.

Figure 8:
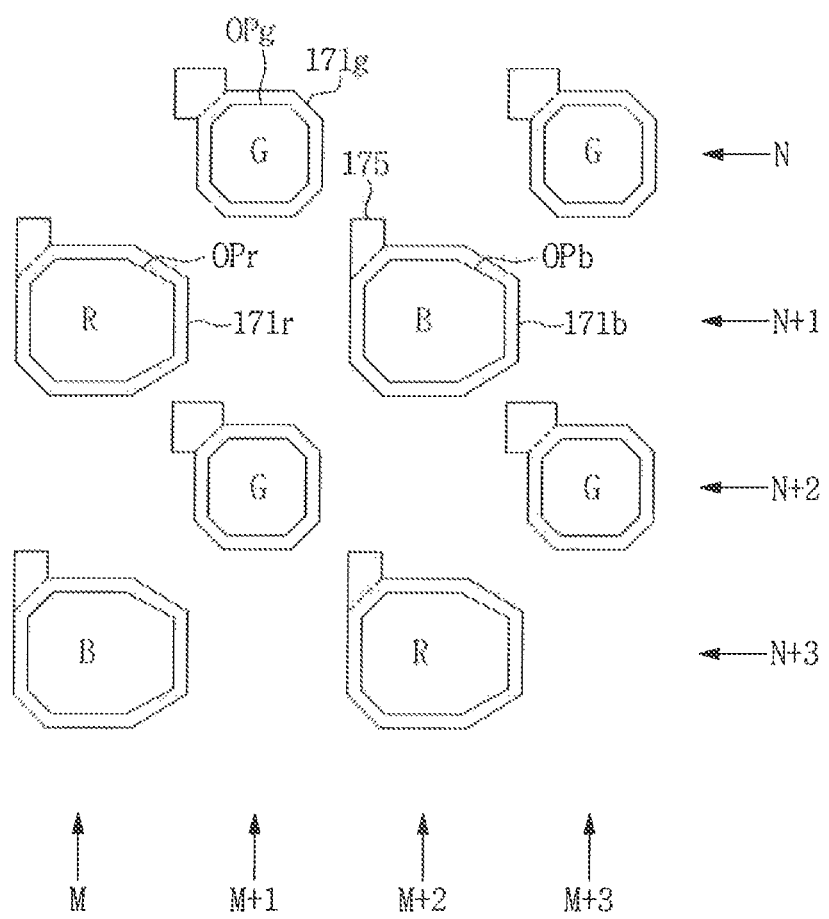
FIG. 8 is a schematic plan view illustrating a plurality of first electrodes and a plurality of openings of an OLED display device according to an exemplary embodiment of the present invention.

FIG. 8 is a schematic plan view illustrating a plurality of first electrodes and a plurality of openings of an OLED display device according to an exemplary embodiment of the present invention.

Referring to FIG. 8, in an exemplary embodiment, a plurality of openings OPr, OPg, and OPb have shapes substantially identical to a shape of each corresponding one of a plurality of first electrodes 171r, 171g, and 171b on a plane. For example, the first electrodes 171r, 171g, and 171b and the openings OPr, OPg, and OPb corresponding to red, green, and blue light emission layers, respectively, may each have an octagonal shape on a plane.

In the exemplary embodiment shown in FIG. 8, at least one of the first electrodes 171r, 171g, and 171b has an asymmetrical shape on a plane. In addition, at least one of the openings OPr, OPg, and OPb has an asymmetrical shape on a plane.

For example, as illustrated in FIG. 8, in an exemplary embodiment, the first electrodes 171r and 171b corresponding to the red and blue light emission layers have a substantially equal size and a substantially identical shape, and each of the first electrodes 171r and 171b have an asymmetrical shape. Similarly, the openings OPr and OPb corresponding to the red and blue light emission layers have a substantially equal size and a substantially identical shape, and each of the openings OPr and OPb have an asymmetrical shape. However, exemplary embodiments are not limited thereto. For example, in an exemplary embodiment, the first electrode 171g and the opening OPg corresponding to a green light emission layer may also have an asymmetrical shape on a plane.

As described above, according to exemplary embodiments of the present invention, an OLED display device has a plurality of openings defined by (e.g., included in) a pixel defining layer, and at least one of the plurality of openings has an asymmetrical shape on a plane such that a color shift depending on the viewing angle may be substantially reduced or prevented. Exemplary embodiments of the present invention substantially reduce or prevent a color deviation according to the viewing angle, resulting in an OLED display device having improved display characteristics.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. An organic light emitting display device, comprising:
a first switching element connected to a first connection electrode, a first node and a second node;
a second switching element connected to a first gate line, a first data line and the first node;
a third switching element connected to the first gate line, the second node and the first connection electrode;
a fourth switching element connected to a second gate line, an initialization line and the first connection electrode;
a fifth switching element connected to an emission control line, a common power line and the first node;
a sixth switching element connected to the emission control line, the second node and a first electrode;
a seventh switching element connected to a third gate line, the first electrode and the initialization line;
a first capacitor connected to the first connection electrode and the common power line;
a first organic light emission layer disposed on the first electrode;
an eighth switching element connected to a second connection electrode, a third node and a fourth node;
a ninth switching element connected to the first gate line, a second data line and the third node;
a tenth switching element connected to the first gate line, the fourth node and the second connection electrode;
an eleventh switching element connected to the second gate line, the initialization line and the second connection electrode;
a twelfth switching element connected to the emission control line, the common power line and the third node;
a thirteenth switching element connected to the emission control line, the fourth node and a second electrode;

a fourteenth switching element connected to the third gate line, the second electrode and the initialization line;
a second capacitor connected to the second connection electrode and the common power line;
a second organic light emission layer disposed on the second electrode;
an organic layer comprising a first opening exposing at least a part of the first electrode and a second opening exposing at least a part of the second electrode; and
a common electrode disposed on the first and second organic light emission layers,
wherein the first opening overlaps the first connection electrode, the second data line and the common power line,
wherein a first area is surrounded by the first data line, the emission control line, the second data line, and the initialization voltage line,
wherein a second area is surrounded by the second data line, the emission control line, a third data line, and the initialization voltage line,
wherein an entirety of the first opening is disposed within the first and second areas.

2. The organic light emitting display device of claim 1, wherein:
the first opening is divided into a first region and a second region with respect to an imaginary straight line overlapping the second data line, and
the first region is asymmetric with the second region.

3. The organic light emitting display device of claim 2, wherein a planar area of the first region is different from a planar area of the second region.

4. The organic light emitting display device of claim 3, wherein the planar area of the first region and the planar area of the second region have a ratio in a range from about 1:0.1 to about 1:0.9.

5. The organic light emitting display device of claim 2, wherein:
the imaginary straight line passes through a center of a width of the second data line,
a first overlapping area is defined by an area of the first connection electrode overlapping the first region,
a second overlapping area is defined by an area of the second data line overlapping the first region,
a third overlapping area is defined by an area of the second data line overlapping the second region,
a fourth overlapping area is defined by an area of the common power line overlapping the second region, and
a first sum of the first and second overlapping areas is substantially equal to a second sum of the third and fourth overlapping areas.

6. The organic light emitting display device of claim 1, wherein lengths of two opposing sides of a plurality of sides defining an edge of the first opening on a plane are different from each other.

7. The organic light emitting display device of claim 1, wherein:
the first opening overlaps the first electrode,
the first opening has a kite shape on a plane, and
the first electrode has a rhombic shape on the plane.

8. The organic light emitting display device of claim 1, wherein:
the first opening overlaps the first electrode, and
the first opening and the first electrode have a different shape on a plane.

9. The organic light emitting display device of claim 8, wherein:

the first electrode is linearly symmetric with respect to an imaginary straight line overlapping the second data line, and
the first opening is asymmetric with respect to the imaginary straight line.

10. The organic light emitting display device of claim 1, wherein the first electrode has a rhombic shape on a plane.

11. The organic light emitting display device of claim 1, wherein:
the first organic light emission layer comprises one of a red light emission layer, a green light emission layer, and a blue light emission layer, and
the second organic light emission layer comprises another one of the red light emission layer, the green light emission layer, and the blue light emission layer different from the first organic light emission layer.

12. The organic light emitting display device of claim 11, wherein when the red light emission layer and the blue light emission layer are included in the first organic light emission layer and the second organic light emission layer, each of the red light emission layer and the blue light emission layer is divided into a first light emission portion and a second light emission portion with respect to an imaginary straight line overlapping the second data line, and a planar area of the first light emission portion is different from a planar area of the second light emission portion.

13. The organic light emitting display device of claim 11, wherein when the green light emission layer is included in the first organic light emission layer or the second organic light emission layer, the green light emission layer is divided into a first light emission portion and a second light emission portion with respect to an imaginary straight line overlapping the second data line, and a planar area of the first light emission portion is different from a planar area of the second light emission portion.

14. The organic light emitting display device of claim 11, wherein when the red light emission layer and the green light emission layer are included in the first organic light emission layer and the second organic light emission layer, a planar area of the red light emission layer is larger than a planar area of the green light emission layer, and
wherein when the blue light emission layer and the green light emission layer are included in the first organic light emission layer and the second organic light emission layer, a planar area of the blue light emission layer is larger than the planar area of the green light emission layer.

15. The organic light emitting display device of claim 14, wherein when the red light emission layer and the blue light emission layer are included in the first organic light emission layer and the second organic light emission layer, the planar area of the red light emission layer is less than the planar area of the blue light emission layer.

16. The organic light emitting display device of claim 1, wherein the first electrode has a different contour than the first opening.

17. An organic light emitting display device, comprising:
a substrate;
a common power line disposed on the substrate;
a first electrode;
a first organic light emission layer disposed on the first electrode;
a first connection electrode;
a first capacitor connected to the first connection electrode and the common power line;
a first plurality of switching elements, wherein a group of the first plurality of switching elements is connected to the first connection electrode, and at least one of the first plurality of switching elements not included in the group is connected to the common power line;

a second capacitor connected to the common power line;

a second plurality of switching elements, wherein at least one of the second plurality of switching elements is connected to a second data line; and an organic layer comprising an opening exposing at least a part of the first electrode, wherein the opening overlaps the first connection electrode, the second data line and the common power line, wherein a first area is surrounded by the first data line, an emission control line, the second data line, and an initialization voltage line, wherein a second area is surrounded by the second data line, the emission control line, a third data line, and the initialization voltage line, wherein an entirety of the opening is disposed within the first and second areas.

18. The organic light emitting display device of claim 17, wherein:

the opening is divided into a first region and a second region with respect to an imaginary straight line overlapping the second data line, and the first region is asymmetric with the second region.

19. The organic light emitting display device of claim 18, wherein a planar area of the first region is different from a planar area of the second region.

20. The organic light emitting display device of claim 17, wherein:

the opening overlaps the first electrode, the opening has a kite shape on a plane, and the first electrode has a rhombic shape on the plane.

* * * * *